United States Patent
Chen et al.

(10) Patent No.: US 10,734,339 B2
(45) Date of Patent: Aug. 4, 2020

(54) BOND PAD STRUCTURE FOR BONDING IMPROVEMENT

(71) Applicant: Taiwan Semiconductor Manufacturing Co., Ltd., Hsin-Chu (TW)

(72) Inventors: Chia-Chan Chen, Zhubei (TW); Yueh-Chuan Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/360,317

(22) Filed: Mar. 21, 2019

(65) Prior Publication Data
US 2019/0221534 A1   Jul. 18, 2019

Related U.S. Application Data

(62) Division of application No. 15/154,289, filed on May 13, 2016, now Pat. No. 10,276,524.

(51) Int. Cl.
*H01L 23/00* (2006.01)
*H01L 27/146* (2006.01)

(52) U.S. Cl.
CPC .............. *H01L 24/08* (2013.01); *H01L 24/05* (2013.01); *H01L 27/1464* (2013.01);
(Continued)

(58) Field of Classification Search
CPC .............. H01L 24/02–17; H01L 33/62; H01L 2224/01–02123; H01L 2224/023;
(Continued)

(56) References Cited

U.S. PATENT DOCUMENTS

2003/0218259 A1* 11/2003 Chesire .................. H01L 24/05
257/786
2005/0023692 A1   2/2005 Matsunaga et al.
(Continued)

OTHER PUBLICATIONS

Non-Final Office Action dated Feb. 28, 2017 for U.S. Appl. No. 15/154,289.
(Continued)

*Primary Examiner* — Cuong B Nguyen
(74) *Attorney, Agent, or Firm* — Eschweiler & Potashnik, LLC

(57) ABSTRACT

Some embodiments relate to a bond pad structure of an integrated circuit (IC). The bond structure includes a bond pad and an intervening metal layer positioned below the bond pad. The intervening metal layer has a first face and a second face. A first via layer is in contact with the first face of intervening metal layer. The first via layer has a first via pattern. The bond structure also includes a second via layer in contact with the second face of the intervening metal layer. The second via layer has a second via pattern that is different than first via pattern. The second via pattern includes a first group of elongated vias extending in parallel with one another in a first direction and a second group of vias in between the first group of elongated vias. The second group of vias extend in a second direction orthogonal to the first direction.

20 Claims, 12 Drawing Sheets

(52) U.S. Cl.
CPC .. *H01L 27/14636* (2013.01); *H01L 27/14643* (2013.01); *H01L 24/03* (2013.01); *H01L 24/48* (2013.01); *H01L 24/49* (2013.01); *H01L 2224/02331* (2013.01); *H01L 2224/02381* (2013.01); *H01L 2224/034* (2013.01); *H01L 2224/03616* (2013.01); *H01L 2224/03622* (2013.01); *H01L 2224/04042* (2013.01); *H01L 2224/0508* (2013.01); *H01L 2224/05011* (2013.01); *H01L 2224/05012* (2013.01); *H01L 2224/05083* (2013.01); *H01L 2224/05088* (2013.01); *H01L 2224/05089* (2013.01); *H01L 2224/05091* (2013.01); *H01L 2224/05093* (2013.01); *H01L 2224/05095* (2013.01); *H01L 2224/05096* (2013.01); *H01L 2224/05124* (2013.01); *H01L 2224/05147* (2013.01); *H01L 2224/05184* (2013.01); *H01L 2224/05554* (2013.01); *H01L 2224/05562* (2013.01); *H01L 2224/05573* (2013.01); *H01L 2224/05624* (2013.01); *H01L 2224/05647* (2013.01); *H01L 2224/48091* (2013.01); *H01L 2224/48108* (2013.01); *H01L 2224/48227* (2013.01); *H01L 2224/48463* (2013.01); *H01L 2224/48464* (2013.01); *H01L 2224/49171* (2013.01); *H01L 2224/49173* (2013.01); *H01L 2224/85* (2013.01); *H01L 2924/00014* (2013.01)

(58) Field of Classification Search
CPC . H01L 2224/0401–05009; H01L 2224/05548; H01L 2224/08111–08268; H01L 2224/16146; H01L 2224/16165–16168; H01L 2224/16235; H01L 2224/29025–29028; H01L 2224/32146; H01L 2224/32157–32168
See application file for complete search history.

(56) References Cited

U.S. PATENT DOCUMENTS

| | | |
|---|---|---|
| 2006/0131739 A1 | 6/2006 | Cho et al. |
| 2006/0208360 A1 | 9/2006 | Yiu et al. |
| 2009/0020842 A1 | 1/2009 | Shiau et al. |
| 2009/0309232 A1 | 12/2009 | Roy |
| 2011/0024866 A1 | 2/2011 | Tseng et al. |

OTHER PUBLICATIONS

Final Office Action dated Aug. 17, 2017 for U.S. Appl. No. 15/154,289.
Non-Final Office Action dated Jun. 14, 2018 for U.S. Appl. No. 15/154,289.
Notice of Allowance dated Dec. 28, 2018 for U.S. Appl. No. 15/154,289.

* cited by examiner

BOND PAD STRUCTURE FOR BONDING IMPROVEMENT

REFERENCE TO RELATED APPLICATIONS

This Application is a Divisional of U.S. application Ser. No. 15/154,289, filed on May 13, 2016, the contents of which are hereby incorporated by reference in their entirety.

BACKGROUND

Many modern day electronic devices include optical imaging devices (e.g., digital cameras) that use image sensors. An image sensor may be disposed on an integrated circuit (IC) that may include an array of photodetectors and supporting logic. The photodetectors, which can correspond to individual pixels, measure incident radiation (e.g., light) corresponding to an optical image, and the supporting logic facilitates readout of digital data from the IC. The digital data output from the IC corresponds to a digitally encoded representation of the optical image.

Standard IC manufacturing processes can produce ICs with layers having dimensions, such as thickness, based, at least in part, on the function of the IC. For example, an IC may include an electrical interconnect structure, such as a stack of back end of line (BEOL) metal layers. In some embodiments, such as those using frontside illumination (FSI) techniques, the metal layers have openings (apertures) over the individual photodetectors. In backside illumination (BSI) techniques, rather than having light pass through openings in the BEOL metal layers, the sensor is illuminated from the backside (i.e., the face opposite the stack of BEOL metal layers). The optical constraints for BSI are similar to FSI, except in BSI the photodetectors are often positioned closer to microlenses that are disposed on the backside of a substrate. In BSI, the substrate is thinned down to optimize the amount of light that reaches the photodetectors; whereas in FSI the thickness of the BEOL metal layers may be reduced. Accordingly, the thickness of specific layers, such as the metal layers of an interconnect structure and/or the substrate, may be reduced based on the desired functionality of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
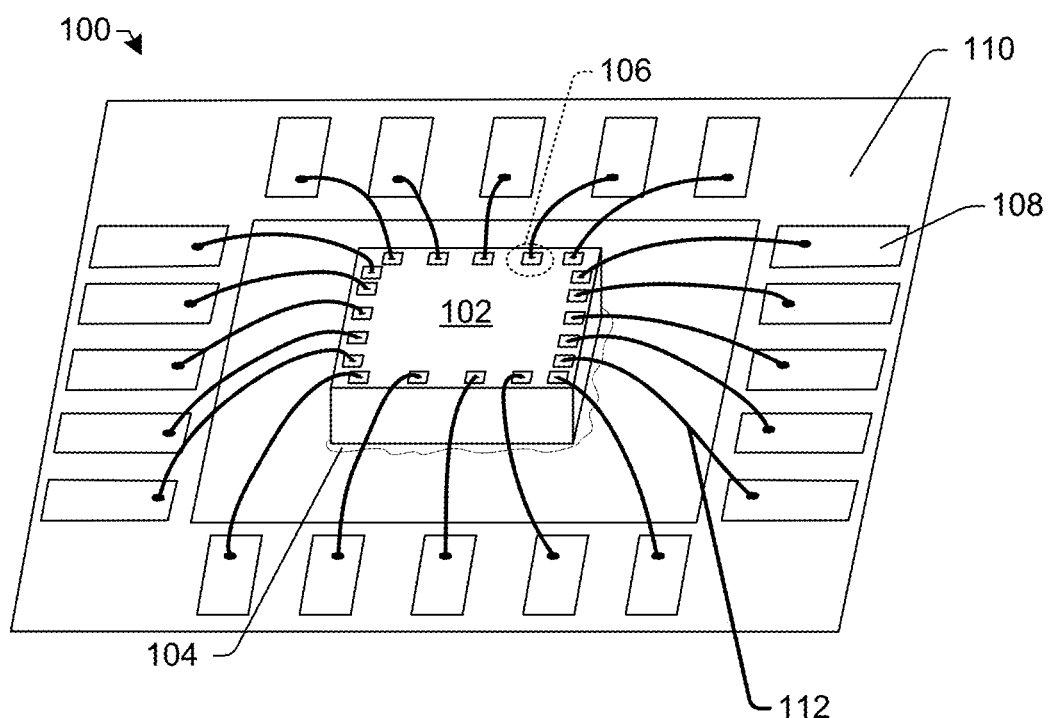
FIG. 1 illustrates a perspective view of an embodiment of a device associated with an integrated circuit (IC) having an improved bond pad structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a device 100 where an integrated circuit 102 is physically adhered to a printed circuit board 110 by epoxy, tape or some other adhesive 104. The integrated circuit 102 has a number of IC bond pads 106 which are electrically coupled to a corresponding number of connection pads 108 on the printed circuit board 110 through a number of wire bonds 112. As discussed above, the IC 102 may include a substrate and an interconnect structure disposed over the substrate, wherein one or both of the substrate and interconnect structure may be thinned down to optimize the IC 102 for a particular function. However, by thinning down one or both of these layers, conventional ICs are more susceptible to stress generated when the wire bonds 112 are pressed onto the IC bond pads 106. The stress may cause defects in formation, such as warping, bending, cracking, peeling of the IC bond pads 106 or layers underlying the IC bond pads 106, which adversely affect the functioning of the IC 102. The result of these defects is often an un-usable IC, leading to wasted resources during the manufacturing process.

It will be appreciated that although FIG. 1 shows an example where an IC 102 is electrically coupled to a printed circuit board 110 through a number of wire bonds 112, in other embodiments, integrated circuits, in the form of dies that are scribed from a processed semiconductor wafer, can be wire bonded to lead frames and are then encapsulated by an epoxy or ceramic housing. In still other embodiments, rather than being wire bonded to a printed circuit board 110, an integrated circuit and/or die can be wire bonded to another integrated circuit or die to form a 3D IC. In addition, although FIG. 1 shows ball type wire bonds, other types of bonds, such as solder bumps and wedge bonds, among others, can also be used.

The present disclosure relates to improved bond pad structures that include multiple vias that reduce the stress put on underlying layers beneath the bond pad structures and thus, improve bonding between the bond pad structures and their underlying surface on the IC. The improved bond pad structures resist defects, like peeling of the metal bond pad from the IC, and help to improve yield and device reliability. Furthermore, the improved bond pad structures compensate for thinned out underlying layers, making ICs with the improved bond pad structures better suited for image sensors, such as complementary metal-oxide semiconductor (CMOS) image sensors.

Figure 2A:
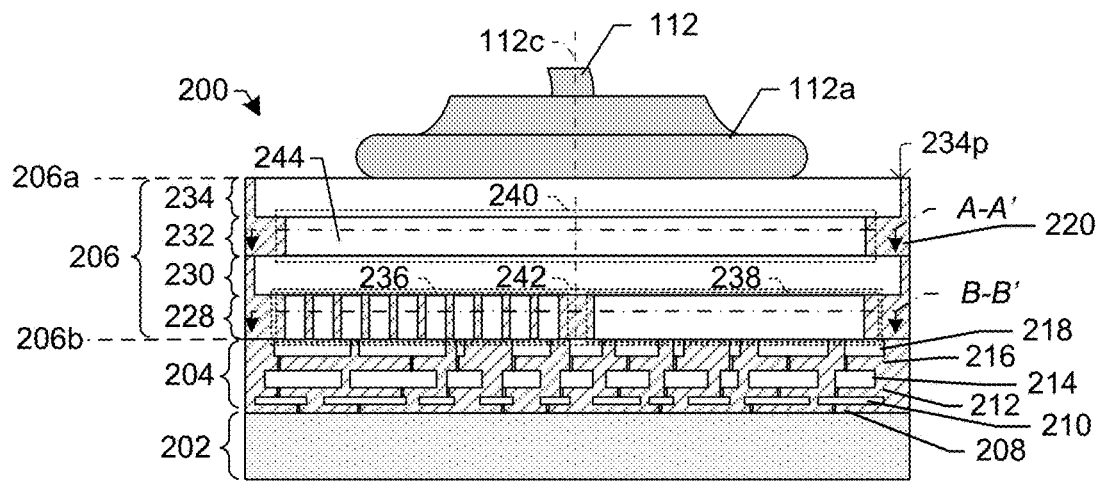
FIG. 2A illustrates a cross-sectional view of an embodiment of an IC having an improved bond pad structure.

FIG. 2A illustrates an example of a portion of an integrated circuit (IC) 200 in accordance with some embodiments of the present disclosure. An IC for use with a sensor, such as an FSI IC or BSI IC may have additional components not shown here, such as diodes, photodetectors, apertures, etc. These components may be used in other embodiments having an improved bond pad structure. The IC 200 is a generalized example. The IC 200 includes a substrate 202 with an interconnect structure 204 there over. A bond pad structure 206, which can correspond, for example to bond pad 106 in FIG. 1, overlies the interconnect structure 204. A wire bond 112 having a bulbous foot region 112a can be bonded to an upper surface of the bond pad structure 206.

As discussed above, the substrate 202 or the interconnect structure 204 may be thinned out to optimize the IC 200 for a particular purpose. The interconnect structure 204 may include a plurality of metal layers and insulating layers that are stacked over one another in an alternating fashion. For example, the interconnect structure 204 includes a first interlayer dielectric (ILD) layer 208, a first metal layer 210, a second ILD layer 212, a second metal layer 214, a third ILD layer 216, and a third metal layer 218. For simplicity, the third metal layer 218 is illustrated as the uppermost metal layer in the interconnect structure 204 in this example, but in general any number of metal layers and ILD layers may be present. The first ILD layer 208, second ILD layer 212, and third ILD layer 216 may be made of a dielectric material such as a low-κ dielectric material. The first metal layers 210, second metal layer 214, and third metal layer 218 may be made of copper, aluminum, or an aluminum copper compound. Due to the thinness of the substrate 202 and/or thinness of the metal layers (210, 214, 218), which can be on the order or micrometers or smaller and which are surrounded by relatively fragile ILD layers (208, 212, and 216), the metal interconnect structure 204 and/or substrate 202 may not be able to withstand the stress applied if the wire bond 112 were bonded directly to the upper surface of the metal interconnect structure 204.

Accordingly, the bond pad structure 206 overlies the interconnect structure 204 and is configured to reliably receive the wire bond 112 and distribute wire bond stress in a manner that protects the underlying substrate 202 and metal interconnect structure 204. The bond pad structure 206 includes an upper bond pad layer 234, which has an uppermost surface 206a in direct contact with foot region 112a of wire bond 112. A first via layer 228 and a second via layer 232 underlie the upper bond pad layer 234 and provide structural support for the upper bond pad layer 234. An intervening metal layer 230 overlies the second via layer 232 and separates the first via layer 228 from the second via layer 232. The intervening metal layer 230, in combination with the first via layer 228 and second via layer 232, can help distribute downward forces imparted by the wire bond 112 to limit damage to the substrate 202 and/or interconnect structure 204. In particular, the first via layer 232 and second via layer 232 provide structural rigidity not offered by the surrounding ILD layer 220. To provide this structural rigidity, the first via layer 228 and second via layer 232 are made of metal, such as copper or copper aluminum alloy, and are often thicker than uppermost metal layer 218 of interconnect structure 204. The general vertical alignment of the first via layer 228 and second via layer 232 under the upper bond pad layer 234 counteracts the vertical forces when the wire bond 112 is pressed downward onto the upper bond pad layer 234.

The first via layer 228 has a first via pattern 242 that defines a layout of at least one via on the first via layer 228. Likewise, the second via layer 232 has a second via pattern 242 that defines the layout of at least one via on the second via layer 232. The first via layer 228 and the second via layer 232 are generally vertically aligned to provide electrical coupling from the upper bond pad layer 234 to the underlying interconnect structure 204. The first via pattern 242 and the second via pattern 240 are often different from one another. Embodiments of particular via patterns are described in more detail below with respect to FIGS. 2B-2C, 3A-3B, 4A-4B, 5A-5B, and 6A-6E.

Figure 2B:
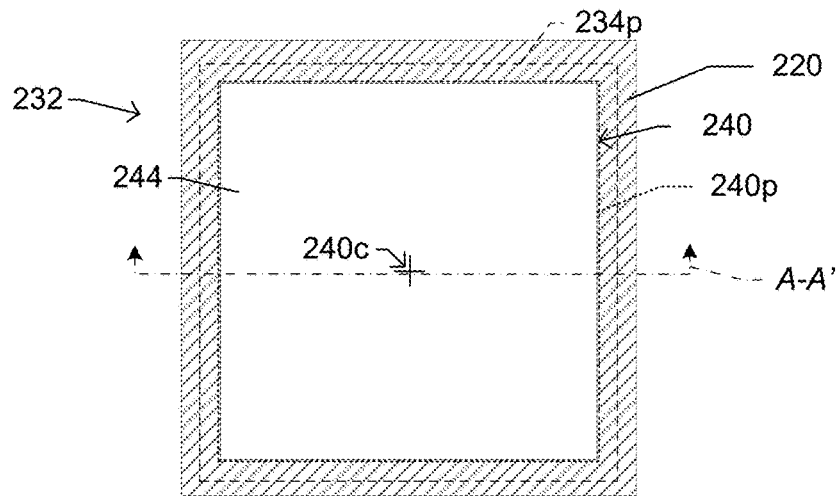
FIG. 2B illustrates a top view of one embodiment of a via layer in an improved bond pad structure.

FIG. 2B illustrates one example where the second via layer 232 has a second via pattern 240. In one embodiment, the second via pattern 240 may include a via portion 244 encompassed by a dielectric material 220. The dielectric material 220 may be fabricated from a dielectric material such as silicon dioxide or a low κ dielectric material including $SiN_x$, SiON, phosposilicate glass (PSG), borophosphosilicate glass (BPSG), etc. The via portion 244 may be a single via fabricated as a metal layer from copper, copper alloy, or other conductive materials. Although the illustrated via portion 244 is square with edges that are equal in length, in other embodiments the via portion 244 can be circular, rectangular, oval, or have other shapes.

The via portion 244 is a single via encompassing a substantial portion of the area of the upper bond pad layer 234. For example, the via portion 244 may have an area that covers 50% or greater the area of conductive material making up the upper bond pad layer 234. In another example, a length of the via portion 244 may be greater than half of the length of the upper bond pad layer 234. Likewise, a width of the via portion 244 may be greater than half of the width of upper bond pad layer 234. The via portion 244 may have a central axis 240c, which is coaxial with a central axis of the foot region (112c, FIG. 2A), and which can be centered under the upper bond pad layer 234. Because the via portion 244 is constructed of a conductive material, such as metal, the second via pattern 240 provides strength that shields the underlying layers from the force of wire bonding. Thus, the second via pattern 240 may provide support at a central region of the IC under the upper bond pad layer 234. In some embodiments, the upper bond pad layer 234 is a continuous sheet of material without any openings in its surface and which has an outer perimeter 234p. The outer perimeter 234p of the upper bond pad can surround and be greater than an outer perimeter of the second via pattern 240p.

Figure 2C:
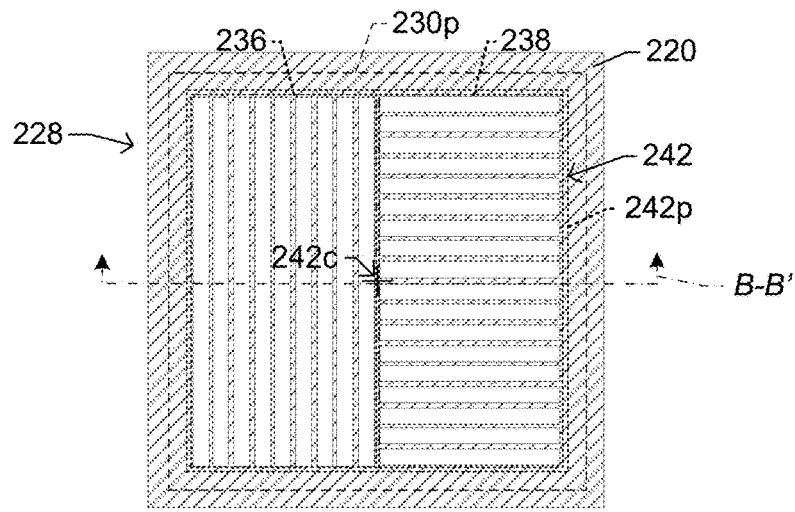
FIG. 2C illustrates a top view of another embodiment of a via layer in an improved bond pad structure.

FIG. 2C illustrates one example of the first via pattern 242, which has a plurality of vias in multiple groups of vias, such as a first group of vias 236 and a second group of vias 238 in dielectric material 220. The first group of vias 236 may have a different arrangement of vias as compared to vias in the second group of vias 238. Suppose that vias of the plurality of vias are elongated. The elongated vias have a longer edge and a shorter edge. The first group of vias 236 may include a plurality of vias extending in parallel with one another in a first direction. The second group of vias 238 may include a plurality of vias extending in parallel with one another in a second direction, which is perpendicular to the first direction. This exemplary second via pattern 242 is only one embodiment of an arrangement of vias. In some embodiments, the intervening metal layer 230 234 is a continuous sheet of material without any openings in its surface and which has an outer perimeter 230p. The outer perimeter 230p can surround and be greater than an outer perimeter of the second via pattern 242p. In some embodiments, outer perimeter 234p of the upper bond pad layer 234 and the outer perimeter 230p of the intervening metal layer 230 are equal to one another and aligned to one another. As will be discussed below, any number of via patterns may be used.

Accordingly, the bond pad structure 206 reduces the amount of stress on underlying layers, such as the interconnect structure 204 and the substrate 202. In particular, the first via layer 228, intervening metal layer 230, and the second via layer 232 distribute the force over IC 200 based, at least in part, on the first and second via patterns. In one embodiment, the efficiency of the bond pad structure 206 to distribute force is based, at least in part, on the first via layer 228 and the second via layer 232 having different via patterns.

Reducing the stress on underlying layers reduces the vulnerability of the IC 200 to defects in formation and thus, improves bonding between the bond pad structure 206 and the underlying surfaces on the IC 200. Accordingly, the improved bond pad structure 206 resists defects and improves yield and device reliability of the IC 200. Furthermore, the bond pad structure 206 is better suited to applications for IC that operate more efficiently with thinned out layers such as a CMOS image sensor (CIS).

It will be appreciated that the first via pattern 242 and the second via pattern 240 illustrated in FIGS. 2A-2C can be vertically transposed or "flipped" with regards to one another in other embodiments. Thus, while FIGS. 2A-2C illustrate an example where the first via pattern 242 is made up of a series of elongated vias which are disposed under a second via pattern 240 which corresponds to a single via portion, in other embodiments the second via pattern 240 and its elongated vias can be arranged under the first via pattern 242 and its single via portion 244. Further, the terms "first" and "second" and other such terms are merely generic identifiers, so the first via pattern could alternatively correspond to a single via portion and the second via pattern could correspond to a series of elongated vias in other embodiments. Other non-limiting examples of the first via pattern and second via pattern are now described, and it will appreciated that these patterns can manifest themselves in a variety of arrangements with regards to the bond pad structure 206 of FIG. 2A.

Figure 3A:
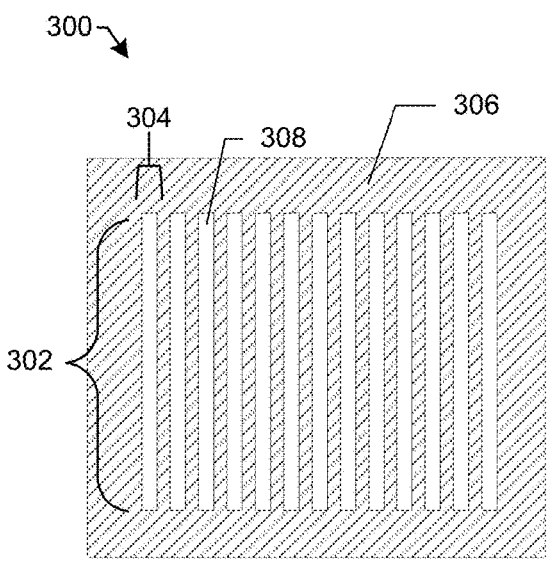
FIG. 3A illustrates a top view of another embodiment of a via layer of an improved bond pad structure.
Figure 3B:
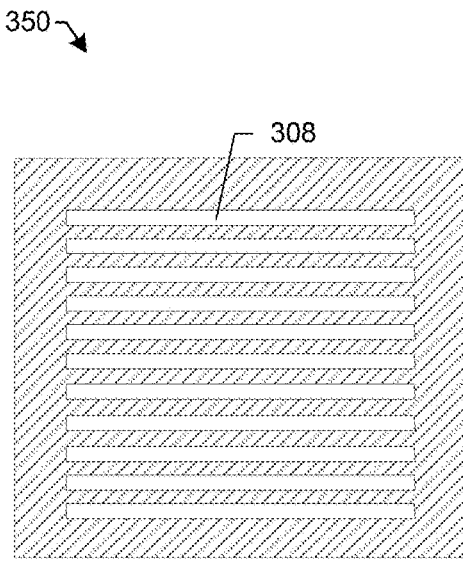
FIG. 3B illustrates a top view of another embodiment of a via layer of an improved bond pad structure.

FIG. 3A illustrates a top view of an embodiment of a via layer 300 in an improved bond pad structure having a plurality of conductive elongated vias 308 in a dielectric material 306. For simplicity, only one elongated via 308 is labeled. The elongated vias 308 each have a longer edge 302 and a shorter edge 304. The elongated vias 308 are aligned with one another such that the longer edges 302 of the elongated vias extend in parallel with one another. The elongated vias 308 may be arranged in one direction, such as parallel to a shorter edge of the via layer 300. As shown in in FIG. 3B, the elongated vias on via layer 350 may be aligned with one another such that the longer edges 302 of the elongated vias extend in parallel with a longer edge of the via layer 300. While the elongated vias 308 in FIGS. 3A and 3B are shown parallel to the edges of the via layer 300, the elongated vias may also be arranged at an angle relative to the edges of the via layer 300, such as at a diagonal.

In one embodiment, the longer edge 302 may have a length greater than half of the length of an overlying bond pad, such as upper bond pad layer 234 in FIG. 2A. The length of the longer edge 302 of the elongated vias, width of the shorter edges 304, and spacing between the elongated vias may be defined to leave a border of dielectric material 306 around the elongated vias 308. The elongated vias 308 may be equally spaced from one another or have variable spacing. As described above with respect to FIG. 2A, multiple via layers are used in the bond pad structure. Accordingly, vias in the first via pattern may be arranged relative to vias in the second via pattern. For example, suppose the first via pattern corresponds to the single via of FIG. 2B and the second via pattern corresponds to the elongated vias of FIG. 3A. The single via may extend in a first direction (e.g. lateral) a length of the elongated vias and extend in a second (e.g., transversally) a width of elongated vias.

Figure 4A:
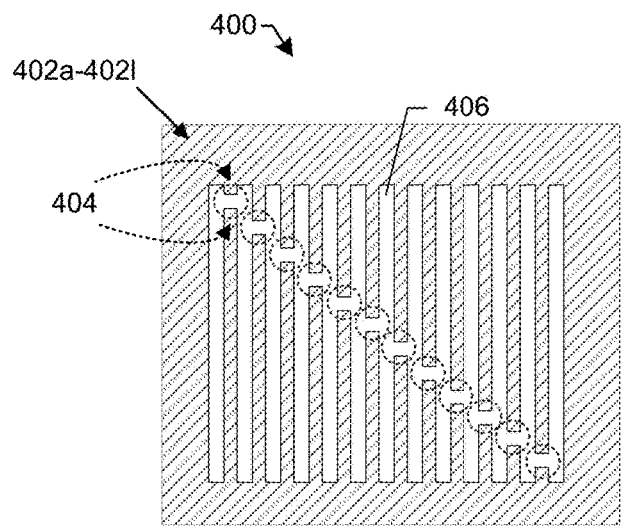
FIG. 4A illustrates a top view of another embodiment of a via layer of an improved bond pad structure.

FIG. 4A illustrates a via layer 400 having a via pattern that includes a via structure 406 made up of elongated vias such as the vias discussed above with respect to FIG. 3A, and a plurality of horizontal vias 402a-1 placed in between the elongated vias. For example, the horizontal vias 402a-1 have a set of opposite edges 404. In one embodiment, the horizontal vias 402a-1 are placed such that the opposite edges 404 are in parallel with the shorter edges of the elongated vias. The horizontal vias 402a-1 may collectively extend in a generally diagonal manner with respect to the elongated vias.

Figure 4B:
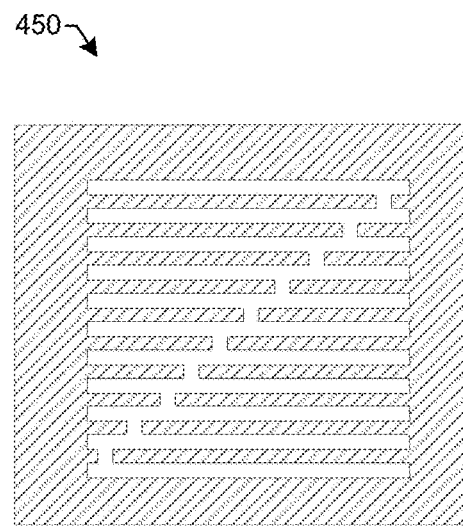
FIG. 4B illustrates a top view of another embodiment of a via layer of an improved bond pad structure.

While the horizontal vias are illustrated extending from an upper left corner of the via layer 400 to the bottom right corner in the top view, the horizontal vias 402a-1 may extend from the upper right corner of the via layer 400 to the bottom left corner of the top view. In one embodiment, the direction of the diagonally arranged horizontal vias 402a-1 may be based on the direction of the elongated vias. In FIG. 4B, the elongated vias are arranged orthogonally with respect to the elongated vias of FIG. 4A. The horizontal vias 402a-1 of via layer 450 of FIG. 4B may be arranged from the upper right corner of the via layer 450 to the bottom left corner of the top view. In another embodiment, the horizontal vias 402a-1 of the via layer 450 extend from the upper right corner of the via layer 400 to the bottom left corner.

Figure 5A:
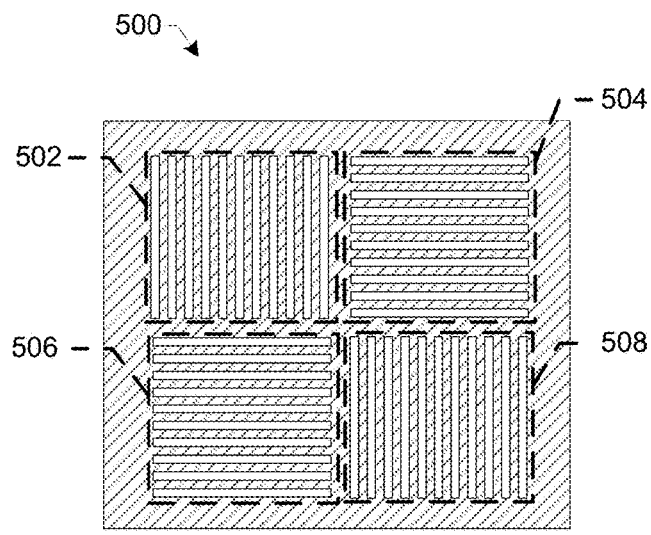
FIG. 5A illustrates a top view of another embodiment of a via layer of an improved bond pad structure.

FIG. 5A illustrates a top view of an embodiment of a via layer 500 in an improved bond pad structure. The via layer 500 has a plurality of groups of elongated vias. For example, a first group 502 of elongated vias 510 are placed such that the longer edge of an elongated via extends in a first direction. A second group 504 of elongated vias may be arranged in a different direction. For example, the second group 504 of elongated vias may be arranged in a second direction orthogonal to the first direction.

A third group 506 of elongated vias on the via layer 500 may be arranged in a similar manner as the second group 504 of elongated vias, and a fourth group 508 of elongated vias may be arranged in a similar manner as the first group 502. The first group 502 is placed in the upper left corner of the via layer 500, the second group 504 is placed in the upper right corner, the third group 506 is placed in the lower left corner, and the fourth group 508 is placed in the lower right corner, as shown in FIG. 5A. This is one example arrangements of groups of elongated vias. The via layer 500 may have more or fewer groups of elongated vias arranged as shown or in a different pattern.

Figure 5B:
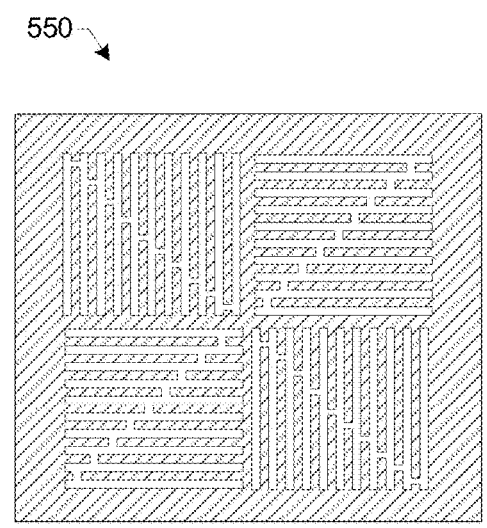
FIG. 5B illustrates a top view of another embodiment of a via layer of an improved bond pad structure.

FIG. 5B illustrates a top view of an embodiment of a via layer 550 in an improved bond pad structure. Via layer 550 has four groups of elongated vias arranged in a similar manner as described above with respect to FIG. 5A. The four groups of elongated vias further include horizontal vias, similar to the horizontal vias 402a-1 described with respect to FIG. 4A. Accordingly, one or more groups on a via layer having a plurality of groups may have horizontal vias positioned between the elongated vias. For example, as shown, each group of elongated vias may have a set of horizontal vias arranged between the elongated vias. Alternatively, only two of the four groups of vias may have horizontal vias.

Figure 6A:
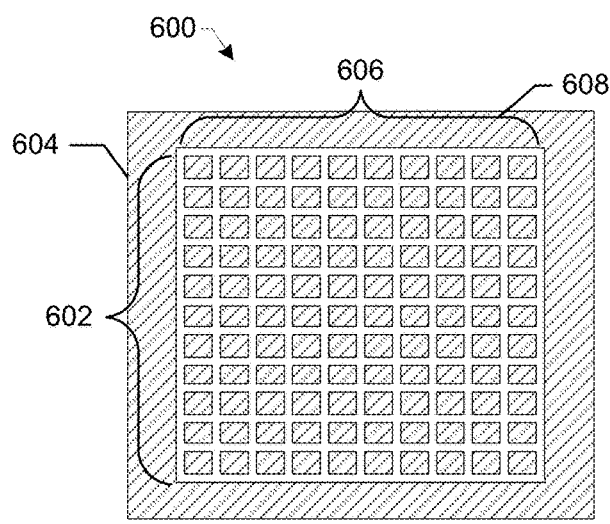
FIG. 6A illustrates a top view of another embodiment of a via layer of an improved bond pad structure.
Figure 6B:
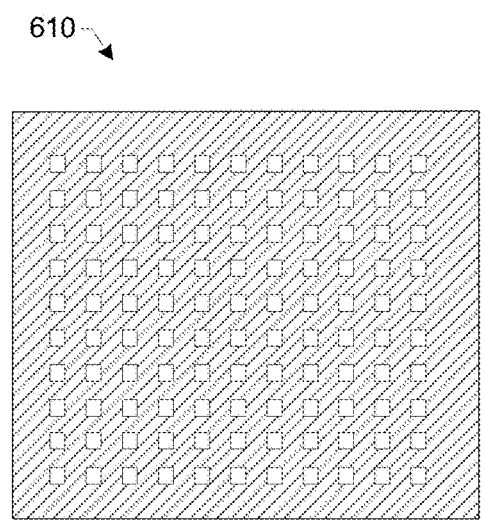
FIG. 6B illustrates a top view of another embodiment of a via layer of an improved bond pad structure.

FIG. 6A illustrates a top view of another embodiment of a via layer 600 in an improved bond pad structure. The via layer 600 has a via pattern that includes overlapping groups of elongated vias. A first group 602 of vias have a long edge parallel to a first side 604 of the via layer 600. A second set of vias 606 have a long edge parallel to a second side 608, which is adjacent to the first side 604. The first group 602 and second group 606 of elongated vias are positioned to overlap to create a via pattern that resembles a grid. In this grid, vias can be arranged at intersections of rows and columns and can be disposed at each and every intersection in the grid (e.g., as illustrated in FIG. 6B). However, in other embodiments, the first group 602 and the second group 606 may be oriented at an angle less than or more than 90 degrees relative to one another, and/or some intersections in the grid may not have vias present.

Figure 6C:
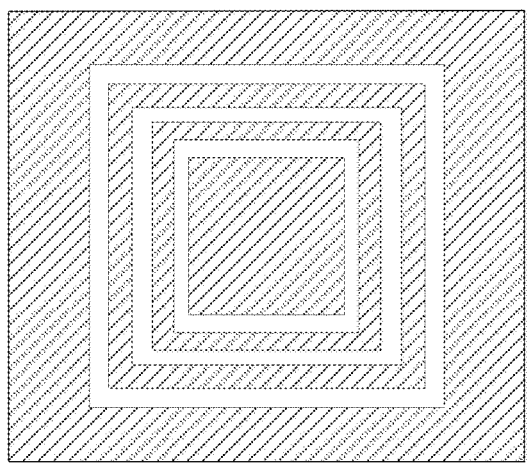
FIG. 6C illustrates a top view of another embodiment of a via layer in an improved bond pad structure.
Figure 6D:
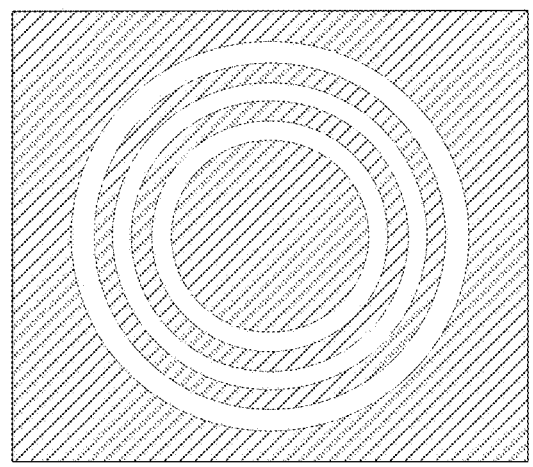
FIG. 6D illustrates a top view of another embodiment of a via layer in an improved bond pad structure.
Figure 6E:
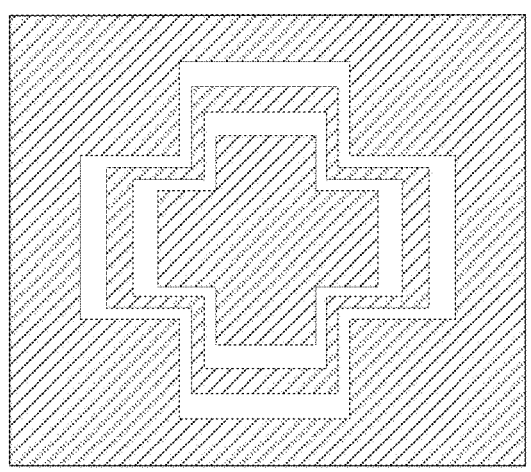
FIG. 6E illustrates a top view of another embodiment of a via layer in an improved bond pad structure.

FIG. 6B illustrates a top view of another embodiment of a via layer 610 in an improved bond pad structure. Although single vias and elongated vias have been discussed above, vias may have any size and shape. For example, the via layer 610 has an array of vias. While vias in the array of vias are illustrated as squares, the vias in the array of vias could be circular, triangular, elliptical, rectangular, etc. Shown here in a grid pattern, the array of vias may be arranged in a different pattern, such as a spiral or circular pattern. For example, FIG. 6C illustrates a top view of an embodiment of a via layer 620 in an improved bond pad structure in which the vias are concentric squares. FIG. 6D illustrates a top view of an embodiment of a via layer 630 in an improved bond pad structure in which the vias are concentric circles. The vias may also have other irregular shapes. For example, FIG. 6E illustrates a top view of an embodiment of a via layer 640 in an improved bond pad structure having concentric vias that are plus-shaped.

FIGS. 2B, 2C, 3A, 3B, 4A, 4B, 5A, 5B, 6A, 6B, 6C, 6D, and 6E are examples of via layers having different types of vias (e.g., single via, elongated vias, an array of vias) arranged in a number of different patterns. These via layers are exemplary and not exhaustive of the different types of vias, via patterns, or via layers that could be employed in an embodiment of an IC having an improved bond pad structure, as described in FIG. 2A.

Figure 7:
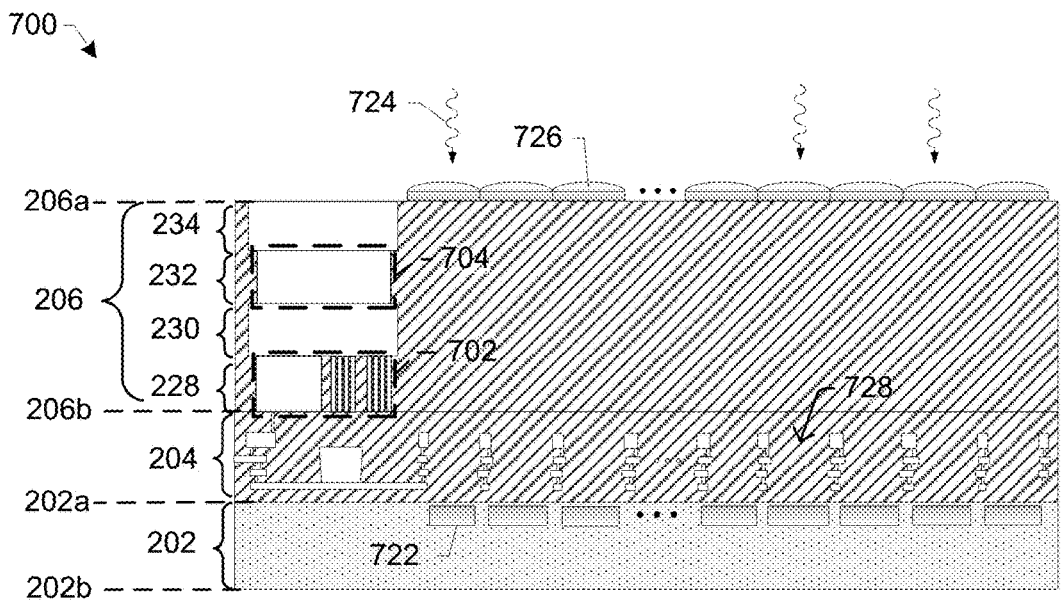
FIG. 7 illustrates a cross-sectional view of another embodiment of an IC having an improved bond pad structure.

FIG. 7 illustrates a cross-sectional view of IC 700 in the form of a FSI image sensor device having an improved bond pad structure. The FSI image sensor device 700 has substrate 202, interconnect structure 204, and the improved bond pad structure 206 such as described above with respect to FIG. 2A. The bond pad structure 206 has first via layer 228, intervening metal layer 230, second via layer 232, and upper bond pad layer 234 that can operate in a similar manner as described above with respect to FIG. 2A.

The substrate 202 has a first (e.g., upper) surface 202a configured to receive illumination and a second (e.g., backside) surface 202b opposite the first surface. An array of photo detectors 722 is arranged in the substrate 202 between the first and second surfaces. Incident light 724 passes through microlenses 726, which help guide the light through apertures 728 in the interconnect structure 204 to strike the array of photo detectors 722. For simplicity, only one aperture 728 has been labeled. Because the bond pad structure 206 may block light, it is typically arranged to the side of the array of photo detectors 722 and is not arranged directly over the array of photo detectors 722. Because thinned out metal layers in the interconnect structure 204 promote increased light absorption by the photo detectors 722, the bond pad structure 706 is well suited for use in such an FSI image sensor device. This is because the bond pad structure 706 provides the IC with a good balance of high efficiency light gathering and high structural rigidity to withstand stresses like wire bonding.

Figure 8:
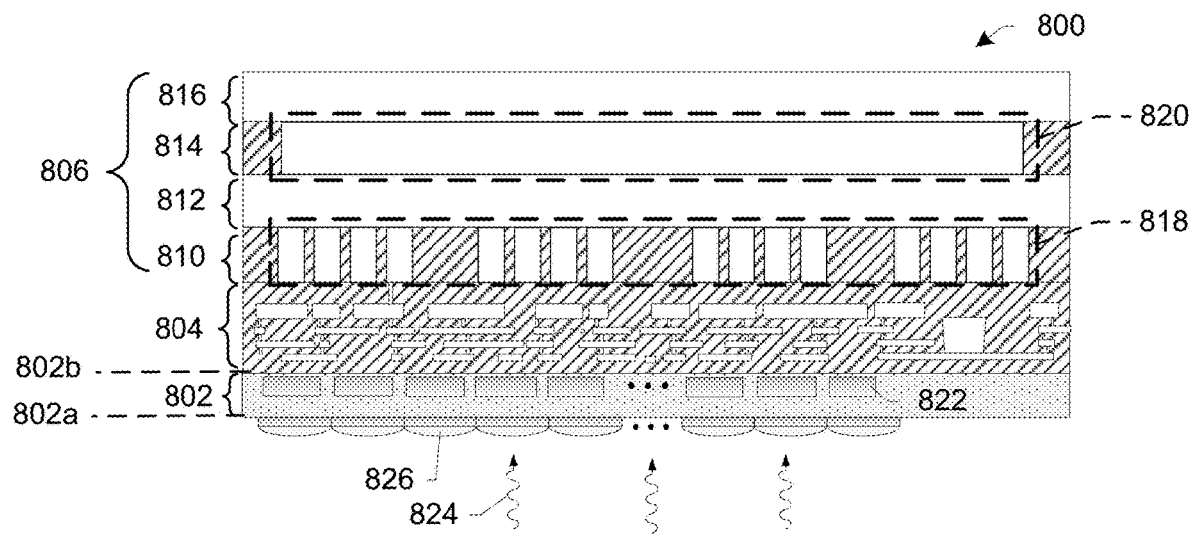
FIG. 8 illustrates a cross-sectional view of an embodiment of an integrated circuit (IC) in the form of a back side illumination (BSI) sensor having an improved bond pad structure.

FIG. 8 illustrates a cross-sectional view of an embodiment of an IC 800 in the form of a back side illumination (BSI) sensor having an improved bond pad structure. The IC 800 has a substrate 802, an interconnect structure 804, and an improved bond pad structure 806 that operate in a similar manner as the IC 200 described above with respect to FIG. 2A. The bond pad structure 806 has a first via layer 810, an intervening metal layer 812, a second via layer 814, and a bond pad layer 816. The first via layer 810 has a via pattern 818 and the second via layer 814 has a via pattern 820.

The substrate 802 that has a first surface 802a configured to receive illumination and a second surface 802b opposite the first surface. An array of photodetectors 822 is arranged the substrate 802 between the first 802a and second 802b surfaces. In one embodiment, the substrate 802 is thinned down as compared to the substrate 202 to facilitate the transmission of light through the substrate 802 to photodetectors 822. Incident light 824 passes through microlenses 826 and the substrate 802 before striking the array of photo detectors 822. Due to the thinness of the substrate 802, the bond pad structure 806 is well suited to BSI sensor applications as it makes the overall IC more capable of withstanding stresses like wire bonding.

Figure 9:
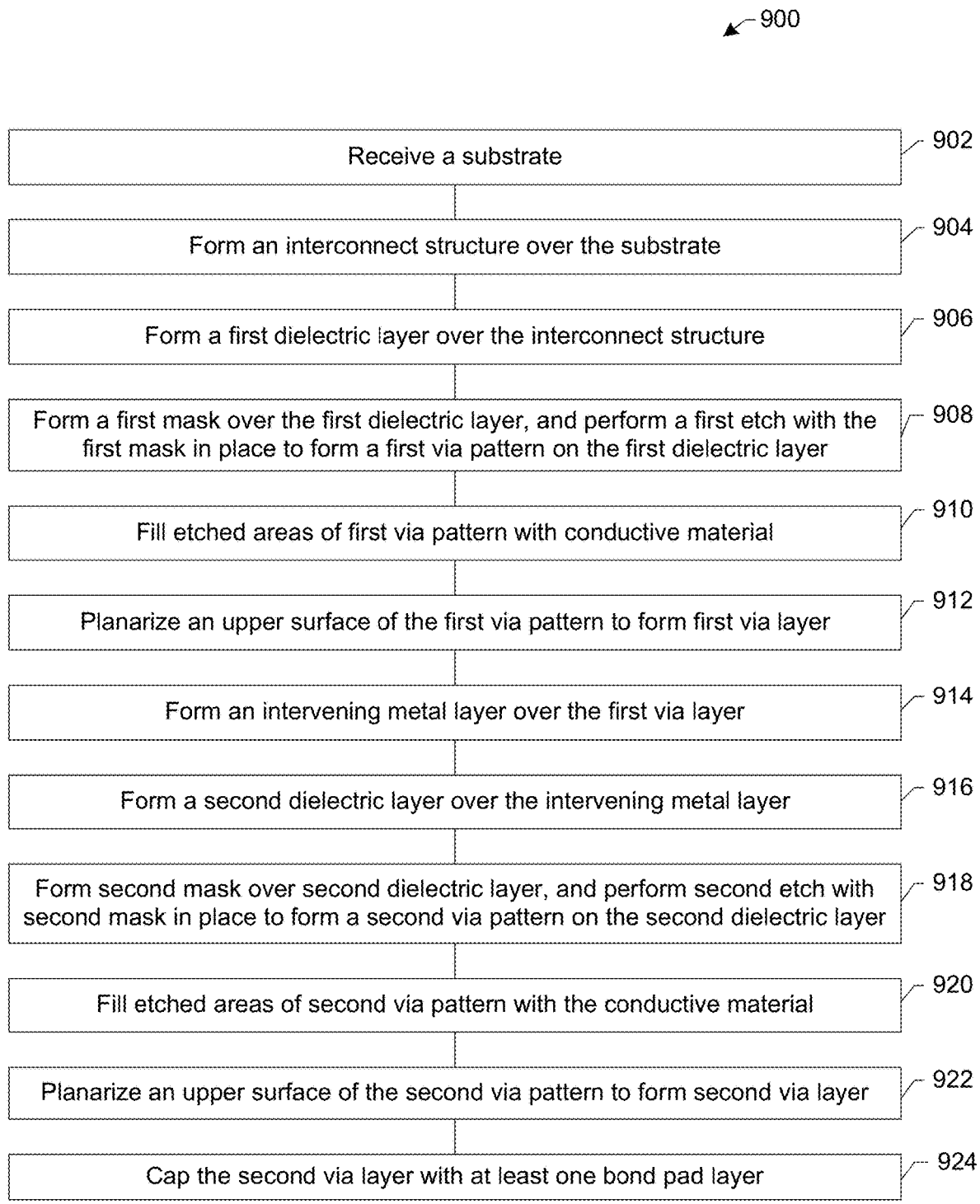
FIG. 9 illustrates a flowchart of some embodiments of a method for manufacturing a IC having an improved bond pad structure.

FIG. 9 illustrates a flowchart of some embodiments of a method 900 for manufacturing an IC having an improved bond pad structure.

At 902, a substrate, such as substrate 202 in FIG. 2A, is received. In one embodiment, the substrate may include sensors. For example, photodetectors may be disposed in the substrate.

At 904, an interconnect structure, such as interconnect structure 204 in FIG. 2A, having one or more metallization layers and interlayer dielectric (ILD) layers is formed over the substrate. The metallization layers are stacked between the ILD layers. The metallization layers are electrically coupled to one another by vias.

At 906, a first dielectric layer, such as lower portion of dielectric layer 220 in FIG. 2A, is formed over the interconnect structure 204. The first dielectric layer is formed of a dielectric material, such as a low-k dielectric material. The first dielectric layer may be formed using vapor deposition (e.g., chemical vapor deposition (CVD) or plasma vapor deposition (PVD)), thermal oxidation, or any other suitable deposition technique.

At 908, a first mask is formed over the first dielectric layer. A first etch is performed with the first mask in place to expose an upper metal layer within the interconnect structure.

At 910, a conductive layer is formed over the etched first dielectric layer. The conductive layer is formed such that the etched areas of the first dielectric layer are filled with conductive material, such as aluminum, copper, tungsten, or metal alloys. The conductive layer may be formed, for example, by CVD, PVD, electroplating, sputtering, or any other deposition technique.

At 912, chemical mechanical planarization (CMP) is performed to planarize an upper surface of the conductive layer to form a first via layer, such as first via layer 228 in FIG. 2A.

At 914, an intervening metal layer, such as intervening metal layer 230 in FIG. 2A, is formed over the first via layer.

At 916, a second dielectric layer, such as an upper portion of dielectric layer 220 in FIG. 2A, is formed over the intervening metal layer. The second dielectric layer may be formed using vapor deposition (e.g., chemical vapor deposition (CVD) or plasma vapor deposition (PVD)), thermal oxidation, or any other suitable deposition technique.

At 918, a second mask is formed over the second dielectric layer. A second etch is performed with the second mask in place to expose an upper surface of the intervening metal layer and to form a second via pattern in direct contact with the intervening metal layer. After the second etch, the second mask may be removed.

At 920, the etched areas of the second via pattern are filled with a conductive material. The conductive material is formed such that the etched areas of the second dielectric layer are filled with conductive material, such as aluminum, copper, tungsten, or metal alloys. The conductive layer may be formed, for example, by CVD, PVD, electroplating, sputtering, or any other deposition technique.

At 922, CMP is performed to planarize an upper surface the second via pattern and to form a second via layer, such as second via layer 232 in FIG. 2A.

At 924, the second via layer 232 is capped with an upper bond pad layer 234. The upper bond pad layer 234 may include one or more bond pads and may be made of copper, aluminum, or an aluminum copper compound, etc.

With reference to FIGS. 10-21, a series of cross-sectional views that collectively illustrate an example manufacturing flow consistent with some examples of FIG. 9 is provided.

Figure 10:
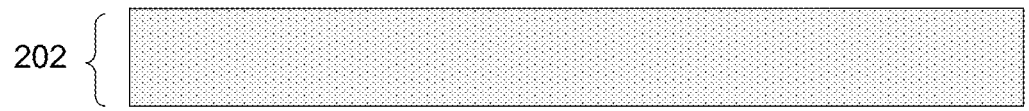
FIGS. 10-22 illustrate a series of cross-sectional views that collectively illustrate an example manufacturing flow consistent with the method of FIG. 9.

FIG. 10 illustrates a cross-sectional view of some embodiments corresponding to Act 902 of FIG. 9. In FIG. 10 a substrate 202 is received. In some embodiments, the substrate 202 can be a bulk silicon substrate or a semiconductor-on-insulator (SOI) substrate (e.g., silicon on insulator substrate) in the form of a disc-like wafer. The substrate 202 may also be a binary semiconductor substrate (e.g., GaAs), a tertiary semiconductor substrate (e.g., AlGaAs), a higher order semiconductor substrate, or even a sapphire substrate. The substrate 202 can include doped regions formed in or on the substrate, epitaxial layers formed in or on the substrate, insulating layers formed in or on the substrate, photoresist layers formed in or on the substrate 202, and/or conducting layers formed in or on the substrate 202. In many instances, the substrate 202, when in the form of a wafer, can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as a "6 inch"); 200 mm (7.9 inch, usually referred to as "8 inch"); 300 mm (11.8 inch, usually referred to as "12 inch"); or 450 mm (17.7 inch, usually referred to as "18 inch"); for example.

Figure 11:
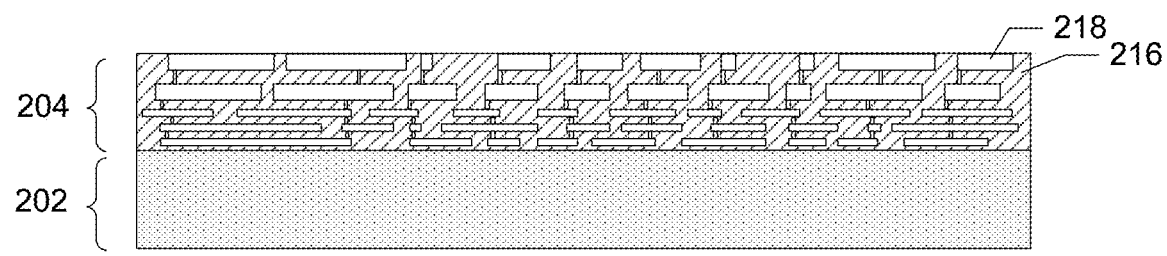

FIG. 11 illustrates a cross-sectional view of some embodiments corresponding to Act 904 of FIG. 9. As discussed above, the interconnect structure 204 includes a series of metallization layers, such as uppermost metal layer 218, which are stacked between ILD layers, such as ILD layer 216. The ILD layers may be, for example, a low κ dielectric or silicon dioxide. The metallization layers and vias may be, for example, a metal, such as aluminum, copper, or tungsten, or a copper aluminum compound.

Figure 12:
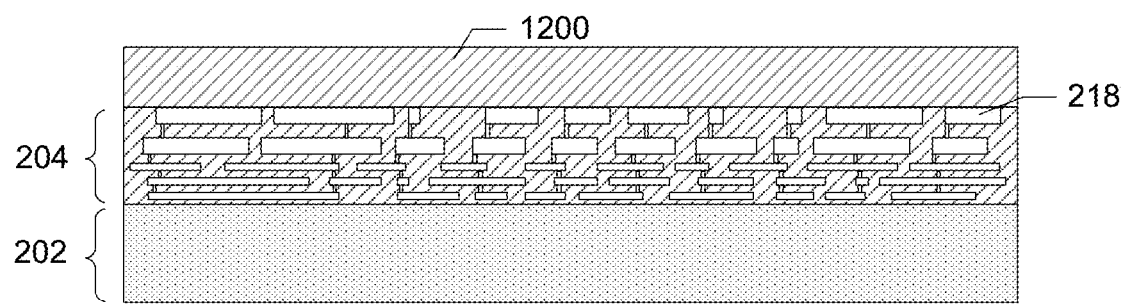

FIG. 12 illustrates a cross-sectional view of some embodiments corresponding to Act 906 of FIG. 9. A first dielectric layer 1200 is formed over the interconnect structure 204. The first dielectric layer 1200 may be a dielectric material, such as a low-k dielectric material.

Figure 13:
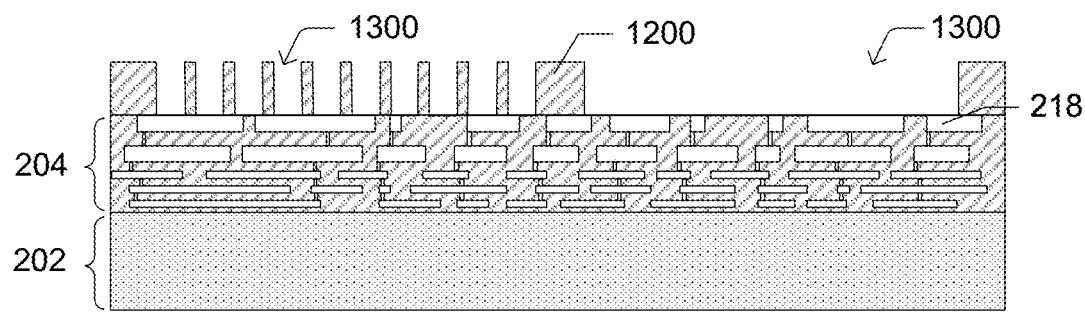

FIG. 13 illustrates a cross-sectional view of some embodiments corresponding to Act 908 of FIG. 9. A first etch is performed with a first mask (not shown) in place to form a first via pattern made up of openings 1300 though which an upper metal layer, such as metal layer 218, within the interconnect structure 204 is exposed. For clarity, only two openings 1300 are labeled. The first mask corresponds to a first via pattern. The first mask may be a photoresist mask, for example, and/or a hard mask, such as a nitride hardmask. After the first etch is performed, the first mask may be removed.

Figure 14:
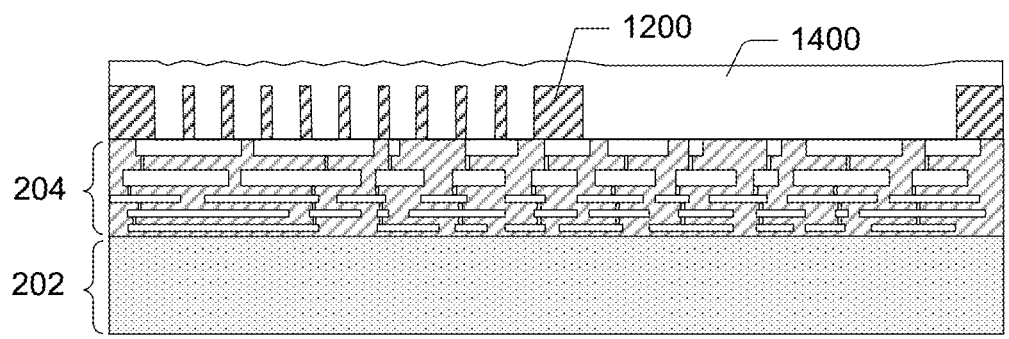

FIG. 14 illustrates a cross-sectional view of some embodiments corresponding to Act 910 of FIG. 9. The openings 1300 in the first dielectric layer are filled with conductive material 1400. The conductive material is formed of a metal composition, such as aluminum, copper, or tungsten, or a copper aluminum compound.

Figure 15:
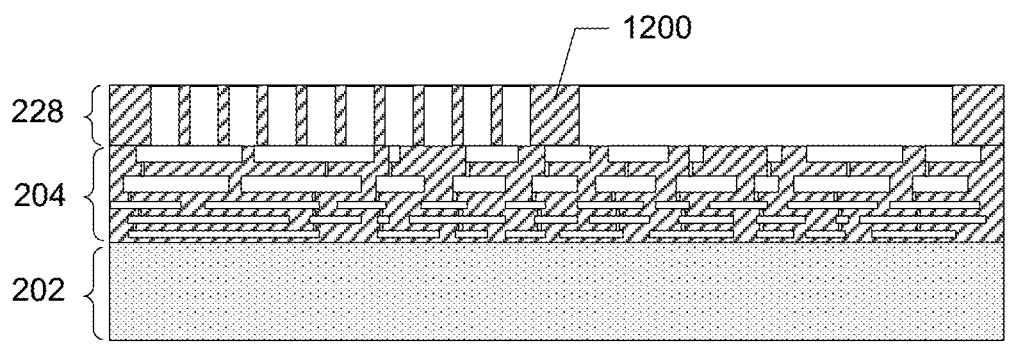

FIG. 15 illustrates a cross-sectional view of some embodiments corresponding to Act 912 of FIG. 9. In FIG. 15 CMP is performed to planarize the conductive material and form a first via pattern layer 228.

Figure 16:
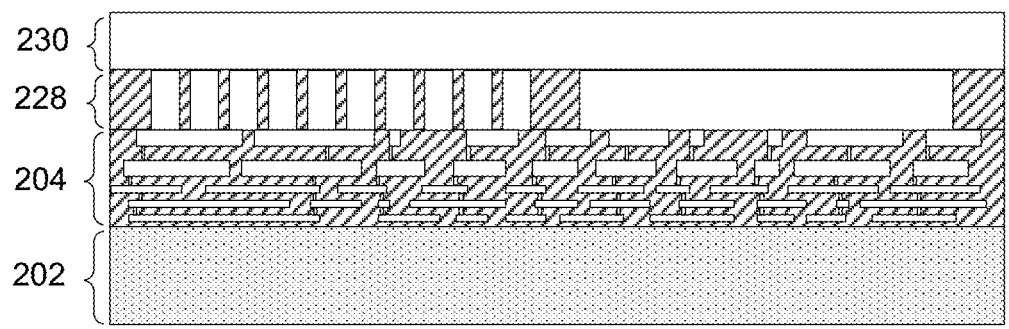

FIG. 16 illustrates a cross-sectional view of some embodiments corresponding to Act 914 of FIG. 9. In FIG. 16, a dielectric (not shown) is formed and patterned to have intervening openings, and an intervening metal layer 230 is formed in the intervening openings over the etched first via layer 228. The intervening metal layer 230 is comprised of a conductive material. The conductive material may be, for example, a metal, such as aluminum, copper, or tungsten, or a copper aluminum compound. The first via layer 228 is in contact with a first face of the intervening metal layer 230.

Figure 17:
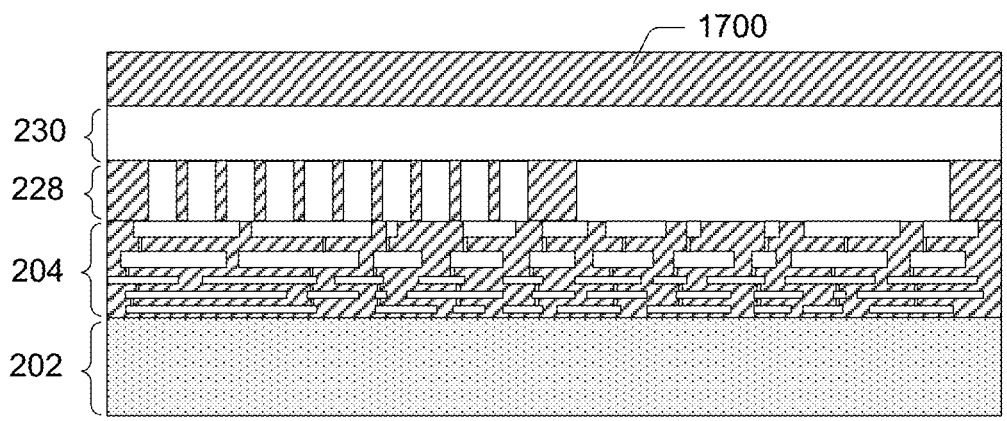

FIG. 17 illustrates a cross-sectional view of some embodiments corresponding to Act 916 of FIG. 9. A second dielectric layer 1700 is formed over the intervening metal layer 230. The second dielectric layer 1700 may be a dielectric material, such as a low-k dielectric material.

Figure 18:
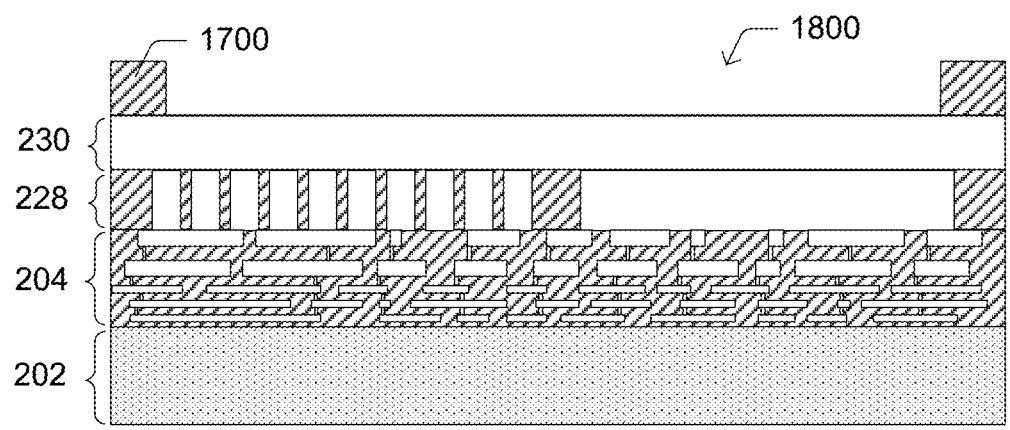

FIG. 18 illustrates a cross-sectional view of some embodiments corresponding to Act 918 of FIG. 9. A second mask (not shown) is formed over the second dielectric layer 1700. The second mask corresponds to a second via pattern. In one embodiment, the first via pattern and the second via pattern are different. Like the first mask, the second mask can be a photoresist mask, for example, and/or a hard mask, such as a nitride hardmask. A second etch is performed with the second mask in place to form series of openings 1800 in the second dielectric layer 1700.

Figure 19:
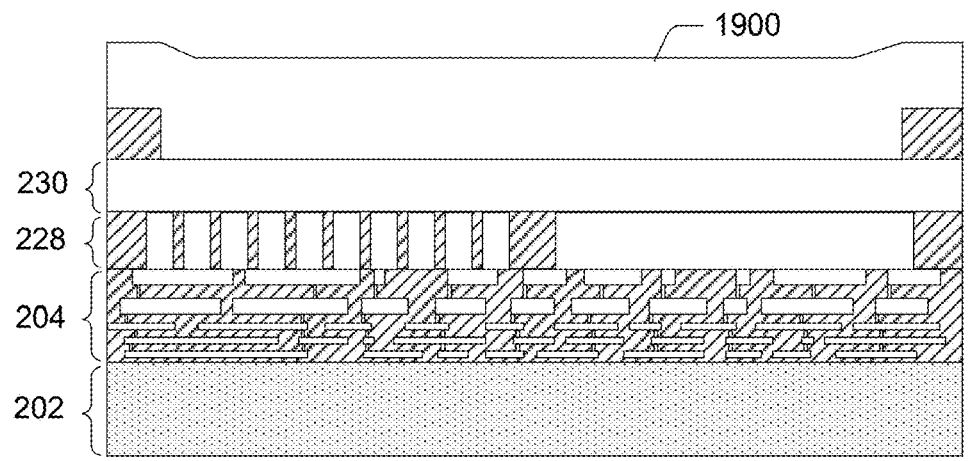

FIG. 19 illustrates a cross-sectional view of some embodiments corresponding to Act 920 of FIG. 9. As shown in FIG. 19, the etched areas are filled with a conductive material which is in direct contact with the intervening metal layer 230. The conductive material 1900 may be, for example, a metal, such as aluminum, copper, or tungsten, or a copper aluminum compound.

Figure 20:
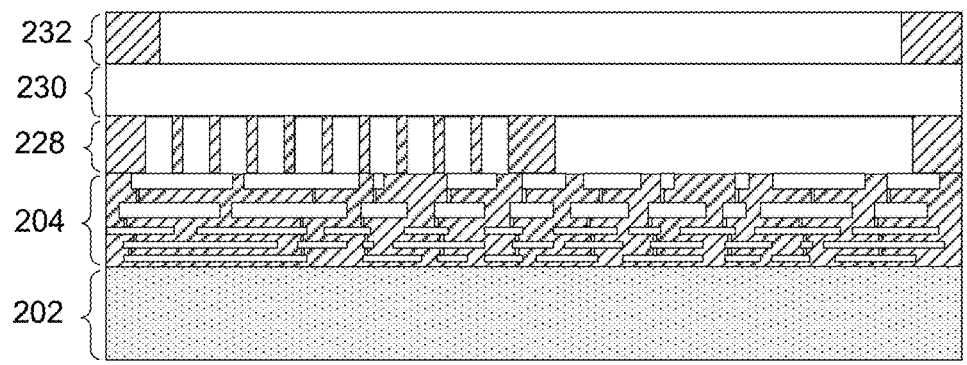

FIG. 20 illustrates a cross-sectional view of some embodiments corresponding to Act 922 of FIG. 9. In FIG. 20, the conductive material 1900 is planarized. In one embodiment, the conductive material is planarized using CMP to form second via layer 232.

Figure 21:
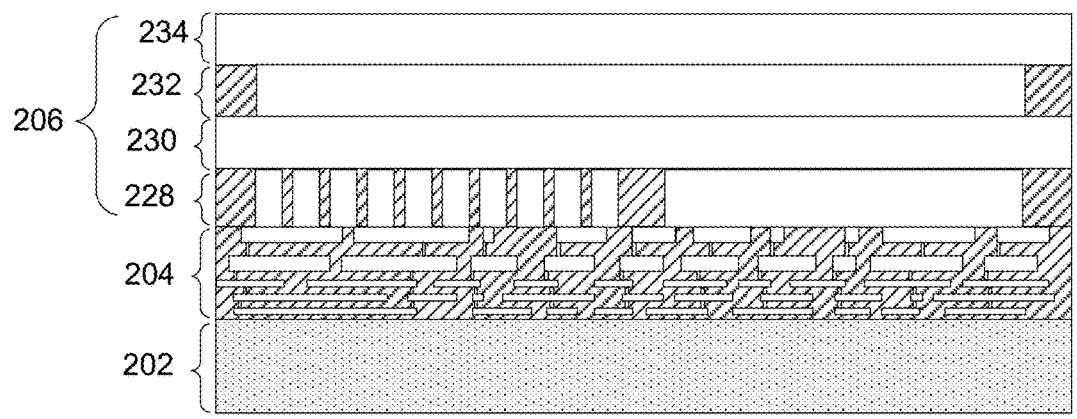

FIG. 21 illustrates a cross-sectional view of some embodiments corresponding to Act 924 of FIG. 9. At 924, the second via layer 232 is capped by an upper bond pad layer 234. The upper bond pad layer 234 may include one or more bond pads, which can be made of aluminum, copper, or a copper aluminum compound.

Figure 22:
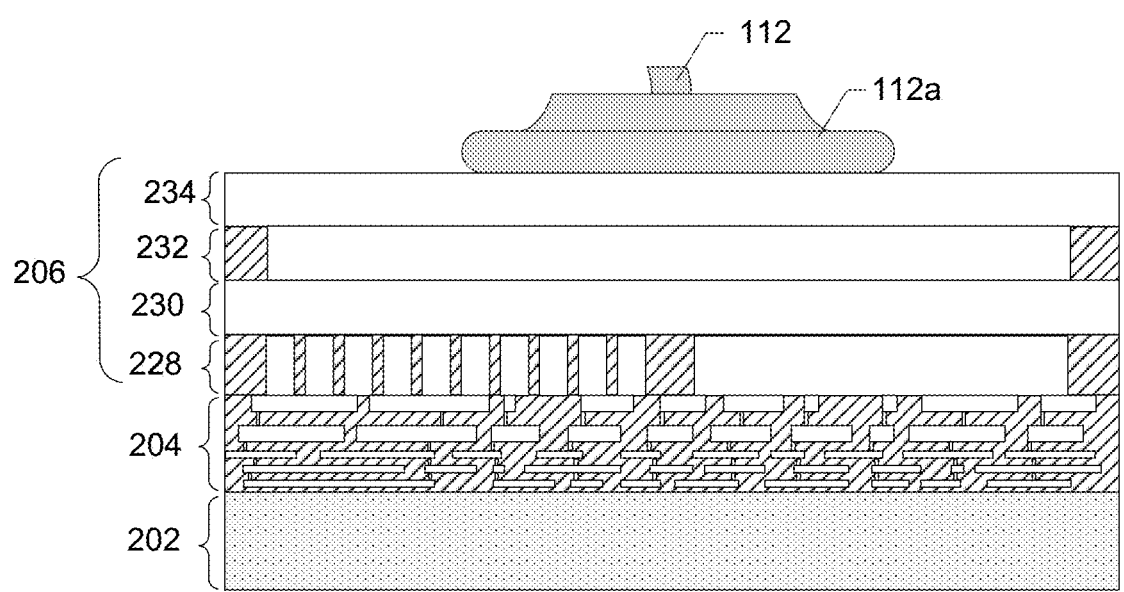

FIG. 22 illustrates a cross-sectional view of some embodiments corresponding to pressing a wire bond 112 on to the upper bond pad layer 234. For example the upper bond pad layer 234 may also include wire structures connected to the one or more bond pads. Pressing the wire bond 112 onto the upper bond pad layer 234 exerts force on the underlying layers. The first via layer 228 and second via layer 232 distribute the stress put on underlying layers and thus, improve bonding between the wire bond 112, upper bond pad layer 234, and the underlying surfaces on the IC. Reducing the stress on underlying layers reduces the vulnerability of the IC to defects in formation and thus, improves bonding between the bond pad structure and the underlying surfaces on the IC. Accordingly, the improved bond pad structure resists defects and improves yield and device reliability of the IC. Furthermore, the bond pad structure is better suited to applications for IC that operate more efficiently with thinned out layers such as a CMOS image sensor as shown in FIGS. 7-8.

In one embodiment, a bond structure of an integrated circuit (IC) includes a bond pad and an intervening metal layer below the bond pad. The intervening metal layer has a first face and a second face. The bond pad structure also includes a first via layer in contact with the first face of the intervening metal layer and a second via layer in contact with the second face of the intervening layer. The first via layer has a first via pattern and the second via layer has a second via pattern. In one embodiment, the first via pattern is different than the second via pattern.

In another embodiment a complementary metal-oxide semiconductor image sensor (CIS) includes an image sensor substrate that has a first surface configured to receive illumination and a second surface opposite the first surface. An array of photodetectors is arranged the image sensor substrate between the first and second surfaces. An image sensor interconnect structure abuts the first surface. The CIS also includes a bond pad structure laterally spaced from the array of the photodetectors. The bond pad structure includes a bond pad layer having a bottom surface and a single via layer in contact with the bottom surface of the bond pad layer. The bond pad structure also includes an intervening metal layer positioned under the single via layer and a via array layer positioned under the intervening metal layer and in contact with the image sensor interconnect structure. The via array layer has a plurality of vias.

In one embodiment, a method for forming a bond pad structure is shown. In the method, a substrate is received. An interconnect structure is formed over the substrate and has an uppermost metal interconnect layer. A first dielectric layer is formed over the metal interconnect layer. The first dielectric layer is etched and patterned to form an array of via openings. The array of via openings is filled with a conductive material to form a first via layer. An intervening metal layer is formed over the first via layer. A second dielectric layer is formed over the intervening metal layer. The second dielectric layer is patterned and etched to form a single via opening over the array of via openings in the first via layer. The single via opening is filled with the conductive material to form a second via layer. A bond pad is formed over the second via layer, wherein a bottom surface of the bond pad is in contact with a top surface of the second via layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bond structure of an integrated circuit (IC), comprising:
   a bond pad;
   an intervening metal layer having a first face and a second face, wherein the intervening metal layer is positioned below the bond pad;
   a first via layer in contact with the first face of the intervening metal layer, wherein the first via layer has a first via pattern;
   a dielectric structure underlying the intervening metal layer; and
   a second via layer in contact with the second face of the intervening metal layer, wherein the second via layer has a second via pattern different than the first via pattern, wherein the second via pattern includes a first group of elongated vias extending in parallel with one another in a first direction and a second group of vias in between the first group of elongated vias, wherein the second group of vias extend in a second direction orthogonal to the first direction, wherein the first group of elongated vias comprises a first elongated via having a first elongated sidewall continuously extending between a first shorter sidewall and a second shorter sidewall, wherein a first via in the second group of vias contacts the first elongated sidewall, wherein the dielectric structure continuously contacts the first elongated sidewall from the first shorter sidewall to a first sidewall of the first via, and wherein the dielectric structure continuously contacts the first elongated sidewall from a second sidewall of the first via to the second shorter sidewall of the first elongated via.

2. The bond structure of the IC of claim 1, wherein the first via pattern includes a single via encompassing a substantial portion of the first via layer.

3. The bond structure of the IC of claim 2, wherein the first group of elongated vias each extend continuously from a first end of the second via pattern to a second end of the second via pattern, the first end is laterally aligned with a first outer sidewall of the single via and the second end is laterally aligned with a second outer sidewall of the single via.

4. The bond structure of the IC of claim 3, wherein an outermost elongated via in the first group of elongated vias has a longer edge laterally aligned with a third outer sidewall of the single via, wherein the third outer sidewall extends continuously between the first and second outer sidewalls of the single via.

5. The bond structure of the IC of claim 1, wherein each via in the second group of vias continuously extends from a longer edge of an elongated via in the first group of elongated vias to a longer edge of another elongated via in the first group of elongated vias.

6. The bond structure of the IC of claim 1, wherein a maximum length and a maximum width of the second group of vias is less than a maximum length and a maximum width of the first group of elongated vias, respectively.

7. The bond structure of the IC of claim 1, wherein the first elongated via in the first group of elongated vias is laterally offset a second elongated via in the first group of elongated vias by a first distance, wherein a length of each via in the second group of vias is equal to the first distance.

8. The bond structure of the IC of claim 1, wherein the first group of elongated vias respectively continuously extend between a first substantially straight line and a second substantially straight line, wherein the first and second substantially straight lines are parallel to one another and continuously extend in the second direction, wherein an outermost via in the second group of vias is laterally offset from the first substantially straight line by a first non-zero distance, and wherein the first non-zero distance is a smallest distance from the second group of vias to the first substantially straight line.

9. The bond structure of the IC of claim 8, wherein each via in the second group of vias is laterally offset from a nearest via in the second group of vias by a non-zero distance.

10. A bond structure of an integrated circuit (IC), comprising:
    a bond pad;
    an intervening metal layer having a first face and a second face, wherein the intervening metal layer is positioned below the bond pad;
    a first via layer in contact with the first face of the intervening metal layer, wherein the first via layer has a first via pattern including a single via, wherein the single via has a single planar bottom surface continuously extending from a first sidewall of the single via to a second sidewall of the single via, wherein the first sidewall is opposite the second sidewall, and wherein the single planar bottom surface contacts the first face of the intervening metal layer; and
    a second via layer in contact with the second face of the intervening metal layer, wherein the second via layer has a second via pattern different than the first via pattern, wherein the second via pattern includes a first group of elongated vias extending in parallel with one another in a first direction and a second group of vias extending between the first group of elongated vias, wherein vias in the second group of vias extend in a second direction orthogonal to the first direction, wherein each elongated via in the first group of elongated vias has a longer edge and a shorter edge, wherein the longer edge of each elongated via extends continuously from the first sidewall of the single via to the second sidewall of the single via.

11. The bond structure of the IC of claim 10, wherein the longer edge of a first outermost elongated via in the first group of elongated vias is aligned with a third sidewall of the single via, wherein the third sidewall of the single via extends between the first and second sidewalls of the single via.

12. The bond structure of the IC of claim 11, wherein the longer edge of a second outermost elongated via in the first group of elongated vias is aligned with a fourth sidewall of the single via, and wherein the fourth sidewall of the single via extends between the first and second sidewalls of the single via.

13. The bond structure of the IC of claim 10, wherein the second group of vias comprises a shorter via disposed between each adjacent pair of elongated vias in the first group of elongated vias, wherein the shorter vias in the second group of vias are evenly spaced along a straight line diagonal to the first group of elongated vias.

14. The bond structure of the IC of claim 13, wherein the shorter via is the only via laterally extending between each adjacent pair of elongated vias.

15. The bond structure of the IC of claim 10, wherein the vias within the second group of vias respectively directly contact a longer edge of a first elongated via in the first group of elongated vias and directly contacts a longer edge of a second elongated via in the first group of elongated vias, wherein the first elongated via neighbors the second elongated via.

16. A bond structure of an integrated circuit (IC), comprising:
    a bond pad;
    an intervening metal layer having a first face and a second face, wherein the intervening metal layer is positioned below the bond pad;
    a first via layer in contact with the first face of the intervening metal layer, wherein the first via layer has a first via pattern including a single via, wherein an outer perimeter of the single via corresponds to an outermost perimeter of the first via layer; and
    a second via layer in contact with the second face of the intervening metal layer, wherein the second via layer has a second via pattern defined within an outermost perimeter of the second via layer, wherein the second via pattern within the outermost perimeter of the second via layer is different than the first via pattern within the outermost perimeter of the first via layer, wherein the second via pattern comprises:
        a first group of elongated vias extending in parallel with one another in a first direction, wherein the elongated vias respectively comprise opposing longer sidewalls and opposing shorter sidewalls extending between the opposing longer sidewalls, wherein the opposing longer sidewalls continuously extend between a first sidewall and a second sidewall of the single via, wherein the opposing shorter sidewalls are aligned with a third and a fourth sidewall of the single via, respectively, and wherein the first and second sidewalls of the single via extend between the third and fourth sidewalls of the single via; and a second group of vias extending in a second direction orthogonal to the first direction, wherein the second group of vias extend between the first group of elongated vias, wherein a maximum length of each via in the second group of vias is less than a maximum length of each elongated via in the first group of elongated vias.

17. The bond structure of the IC of claim 16, wherein a length of the opposing longer sidewalls is at least 15 times greater than a length of the opposing shorter sidewalls.

18. The bond structure of the IC of claim 16, wherein the second group of vias are laterally offset from the first sidewall of the single via in a direction towards the second sidewall of the single via and by a first distance, wherein the first distance is equal to a length of a shorter sidewall in the opposing shorter sidewalls.

19. The bond structure of the IC of claim 16, wherein a longer sidewall and a shorter sidewall of a first elongated via in the first group of elongated vias meet at a first point, wherein an intersection of the first sidewall and the third sidewall of the single via is laterally aligned with the first point, wherein a longer sidewall and a shorter sidewall of a second elongated via in the first group of elongated vias meet at a second point, wherein an intersection of the second sidewall and the fourth sidewall of the single via is laterally aligned with the second point, and wherein the second group of vias are evenly spaced along a straight diagonal line extending between the first point and the second point.

20. The bond structure of the IC of claim 16, wherein the single via has a single planar bottom surface continuously extending from the first sidewall of the single via to the second sidewall of the single via.

\* \* \* \* \*